(12) United States Patent
Ramakrishnan (10) Patent No.: US 11,647,312 B2
(45) Date of Patent: *May 9, 2023

(54) METHODS AND APPARATUS FOR A TRACK AND HOLD AMPLIFIER

(71) Applicant: SEMICONDUCTOR COMPONENTS INDUSTRIES, LLC, Phoenix, AZ (US)

(72) Inventor: Shankar Ramakrishnan, Bangalore (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 484 days.

This patent is subject to a terminal disclaimer.

(21) Appl. No.: 16/444,995

(22) Filed: Jun. 18, 2019

(65) Prior Publication Data

US 2019/0306449 A1    Oct. 3, 2019

Related U.S. Application Data

(63) Continuation of application No. 15/666,781, filed on Aug. 2, 2017, now Pat. No. 10,375,336.

(51) Int. Cl.
| | |
|---|---|
| *H04N 25/778* | (2023.01) |
| *H03F 1/22* | (2006.01) |
| *H03G 1/00* | (2006.01) |
| *H03K 5/08* | (2006.01) |
| *G11C 27/02* | (2006.01) |
| *H03F 1/34* | (2006.01) |
| *H03F 3/72* | (2006.01) |
| *H04N 25/75* | (2023.01) |
| *H04N 25/772* | (2023.01) |
| *H03M 1/12* | (2006.01) |

(52) U.S. Cl.
CPC ........ *H04N 25/778* (2023.01); *G11C 27/026* (2013.01); *H03F 1/223* (2013.01); *H03F 1/34* (2013.01); *H03F 3/72* (2013.01); *H03G 1/0094* (2013.01); *H03K 5/08* (2013.01); *H04N 25/75* (2023.01); *H04N 25/772* (2023.01); *H03F 2203/7221* (2013.01); *H03M 1/1245* (2013.01)

(58) Field of Classification Search
None
See application file for complete search history.

(56) References Cited

U.S. PATENT DOCUMENTS

| | | | | |
|---|---|---|---|---|
| 4,543,534 | A | * 9/1985 | Temes | ................. H03F 3/45479 330/109 |
| 4,783,602 | A | 11/1988 | Viswanathan | |
| 7,692,471 | B2 | 4/2010 | Uno | |
| 9,130,519 | B1 | 9/2015 | Keramat | |
| 10,375,336 | B2 * | 8/2019 | Ramakrishnan | ....... H04N 5/378 |

(Continued)

*Primary Examiner* — Quan Pham
(74) *Attorney, Agent, or Firm* — Joseph F. Guihan (57) ABSTRACT

Various embodiments of the present technology may provide methods and apparatus for a track-and-hold amplifier configured to sample and amplify an analog signal. Methods and apparatus for a track-and-hold amplifier according to various aspects of the present invention may provide an isolation circuit configured to isolate transient current in a track-and-hold capacitor during a track phase. According to various embodiments, selective activation of the isolation circuit provides a settling time that is independent of the gain of the amplifier.

19 Claims, 8 Drawing Sheets

(56) References Cited

U.S. PATENT DOCUMENTS

| | | | |
|---|---|---|---|
| 2002/0175844 A1 | 11/2002 | Bach | |
| 2005/0140537 A1* | 6/2005 | Waltari | H03M 1/1245 |
| | | | 341/162 |
| 2009/0185406 A1 | 7/2009 | Uno | |
| 2009/0206885 A1 | 8/2009 | Sundblad | |
| 2009/0295966 A1* | 12/2009 | Kubo | H04N 5/3658 |
| | | | 348/308 |
| 2011/0102654 A1 | 5/2011 | Hiyama | |
| 2013/0300488 A1* | 11/2013 | Lee | G11C 27/026 |
| | | | 327/337 |
| 2015/0188533 A1* | 7/2015 | Viswanath | G01N 23/046 |
| | | | 378/9 |
| 2017/0118428 A1* | 4/2017 | Muto | H04N 5/378 |
| 2018/0062595 A1 | 3/2018 | Osawa | |

* cited by examiner

METHODS AND APPARATUS FOR A TRACK AND HOLD AMPLIFIER

CROSS-REFERENCE TO RELATED APPLICATION

This application is a continuation of U.S. patent application Ser. No. 15/666,781, filed on Aug. 2, 2017, and incorporates the disclosure of the application in its entirety by reference.

BACKGROUND OF THE TECHNOLOGY

Figure 8:
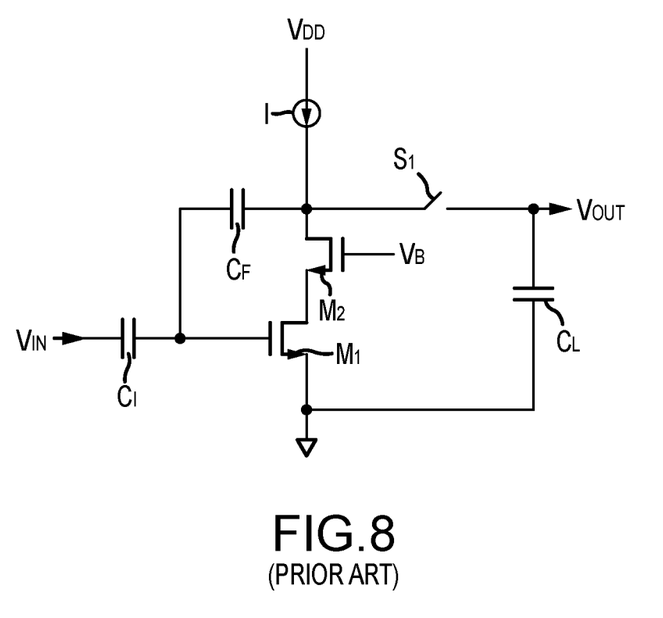
FIG. 8 is a circuit diagram of a conventional track-and-hold amplifier.

Amplifiers are utilized in a wide variety of electronic devices and systems to amplify or attenuate a signal. Track-and-hold amplifiers, such as the amplifier illustrated in FIG. 8, are commonly used in data acquisition systems because they are capable of sampling/tracking an analog signal and holding the value during some other operation, such as analog-to-digital conversion.

In various applications, the settling time of the output signal of the amplifier is an important parameter and may affect the overall performance of the electronic device. For example, in high frame rate and/or high resolution imaging applications, a shorter settling time of the output signal is required to provide the desired frame rate and/or resolution. In addition, in applications that utilize multiple amplifiers, a mismatch in settling time between the amplifiers may manifest itself as noise in the signal, which may adversely affect the final signal.

In general, the settling time may be reduced by increasing the supply current and/or decreasing the size of the sampling capacitor. Decreasing the size of the sampling capacitor, however, increases the kTC (sampling) noise, while increasing the supply current increases the overall power consumption of the device.

SUMMARY OF THE INVENTION

Various embodiments of the present technology may provide methods and apparatus for a track-and-hold amplifier configured to sample and amplify an analog signal. Methods and apparatus for a track-and-hold amplifier according to various aspects of the present invention may provide an isolation circuit configured to isolate transient current in a track-and-hold capacitor during a track phase. According to various embodiments, selective activation of the isolation circuit provides a settling time that is independent of the gain of the amplifier.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various controllers, signal converters, switching devices, current sources, and semiconductor devices, such as transistors, capacitors, and the like, which may carry out a variety of functions. In addition, the present technology may be integrated in any number of electronic systems, such as imaging, automotive, aviation, "smart devices," portables, and consumer electronics, and the systems described are merely exemplary applications for the technology.

Figure 1:
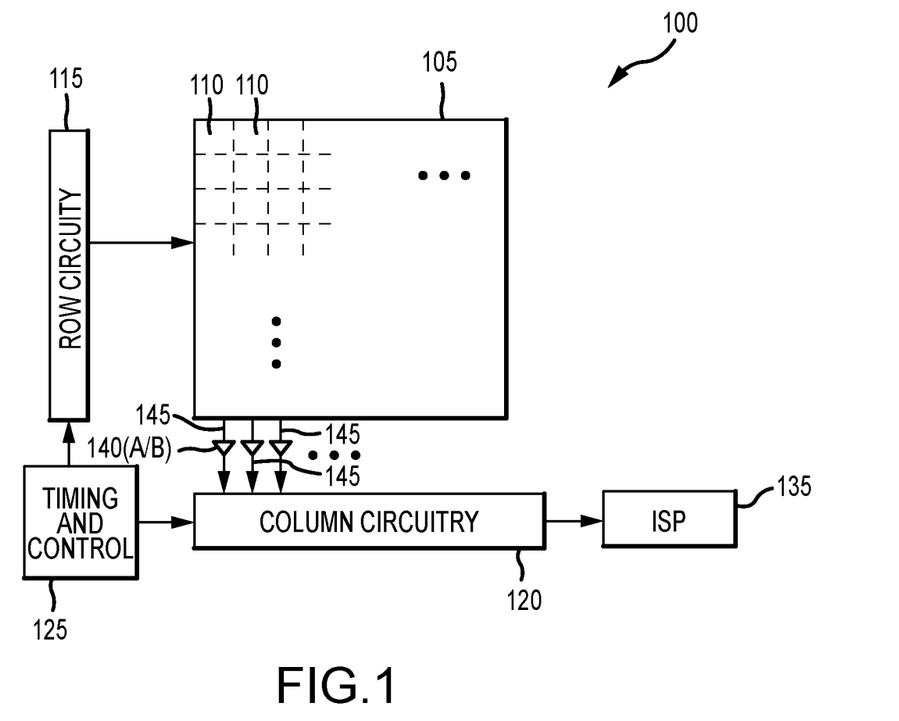
FIG. 1 is a block diagram of a system in accordance with an exemplary embodiment of the present technology.

Referring to FIG. 1, an imaging system 100 may be configured to capture image data by converting charge generated by the light into a voltage, which is used to form a digital image. The imaging system 100 may employ various circuits and/or systems to convert light into a digital image. For example, the imaging system 100 may comprise a pixel array 105 comprising a plurality of pixels 110 arranged in rows and columns to form a pixel array 105. The pixel array 105 may contain any number of rows and columns, for example, hundreds or thousands of rows and columns. In an exemplary embodiment, each pixel 110 comprises a photodetector, such as a photodiode, for capturing light and converting light into an electric signal.

In various embodiments, the imaging system 100 may further comprise row circuitry 115, column circuitry 120, and a timing and control unit 125, for selectively activating sequential rows of pixels and transmitting pixel signals out of the pixel array 105 (i.e., read out). The row circuitry 220 may receive row addresses from the timing and control unit 125 and supply corresponding row control signals, such as reset, row select, charge transfer, and readout control signals to the pixels 110 over a row control path to the pixels 110 in the pixel array 105.

The column circuitry 210 may comprise column control circuitry, analog-to-digital conversion circuitry, readout circuitry, processing circuitry, and/or column decoder circuitry, and the like, and may receive pixel signals, such as analog pixel signals generated by the pixels 110. Column paths 145 may couple each column of the pixel array 105 to the column circuitry 120. The column paths 145 may be used for reading out pixel signals from the pixels 110 and/or supplying bias signal (e.g., bias current or bias voltages).

Each pixel signal may be transmitted to a signal conversion circuit, such as an analog-to-digital converter (ADC)

(not shown). According to various embodiments, the ADC may be selected according to the particular application. For example, the ADC may be configured as a ramp ADC, a SAR (successive approximation register) ADC, a delta-sigma ADC, or any other suitable ADC architecture. The digital pixel data may then be transmitted to and stored in the image signal processor (ISP) 135 for further processing, such as image reconstruction, white balancing, noise reduction, color correction, and the like.

The imaging system 100 may further comprise a track-and-hold amplifier circuit (T/H amp) 140(A/B) configured to sample and amplify an output signal, such as the pixel signal. The T/H amp 140(A/B) may be interposed on the column paths 145 such that each column of the pixel array 105 has a corresponding T/H amp 140(A/B). The T/H amp 140(A/B) may amplify the pixel signal received from an associated column in the pixel array 105, and may provide the received pixel signal with a desired gain (e.g., a dynamic adjustable gain). In various embodiments, the T/H amp 140(A/B) may apply a relatively high gain to the pixel signals, such as when the corresponding pixel captures darker portions of a scene, or may apply a relatively low gain, such as when the corresponding pixel captures brighter portions of a scene. The column circuitry 210 may provide control signals to the T/H amp 140(A/B) to control the gain of the pixel signals.

Figure 2:
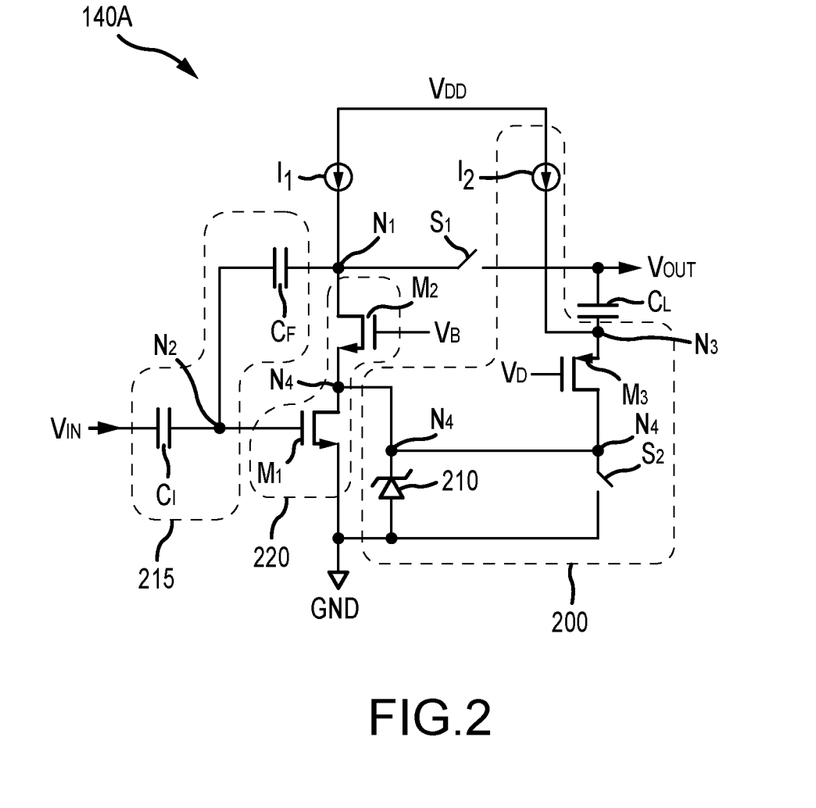
FIG. 2 is a circuit diagram of a single-ended input track-and-hold amplifier in accordance with an exemplary embodiment of the present technology.
Figure 5:
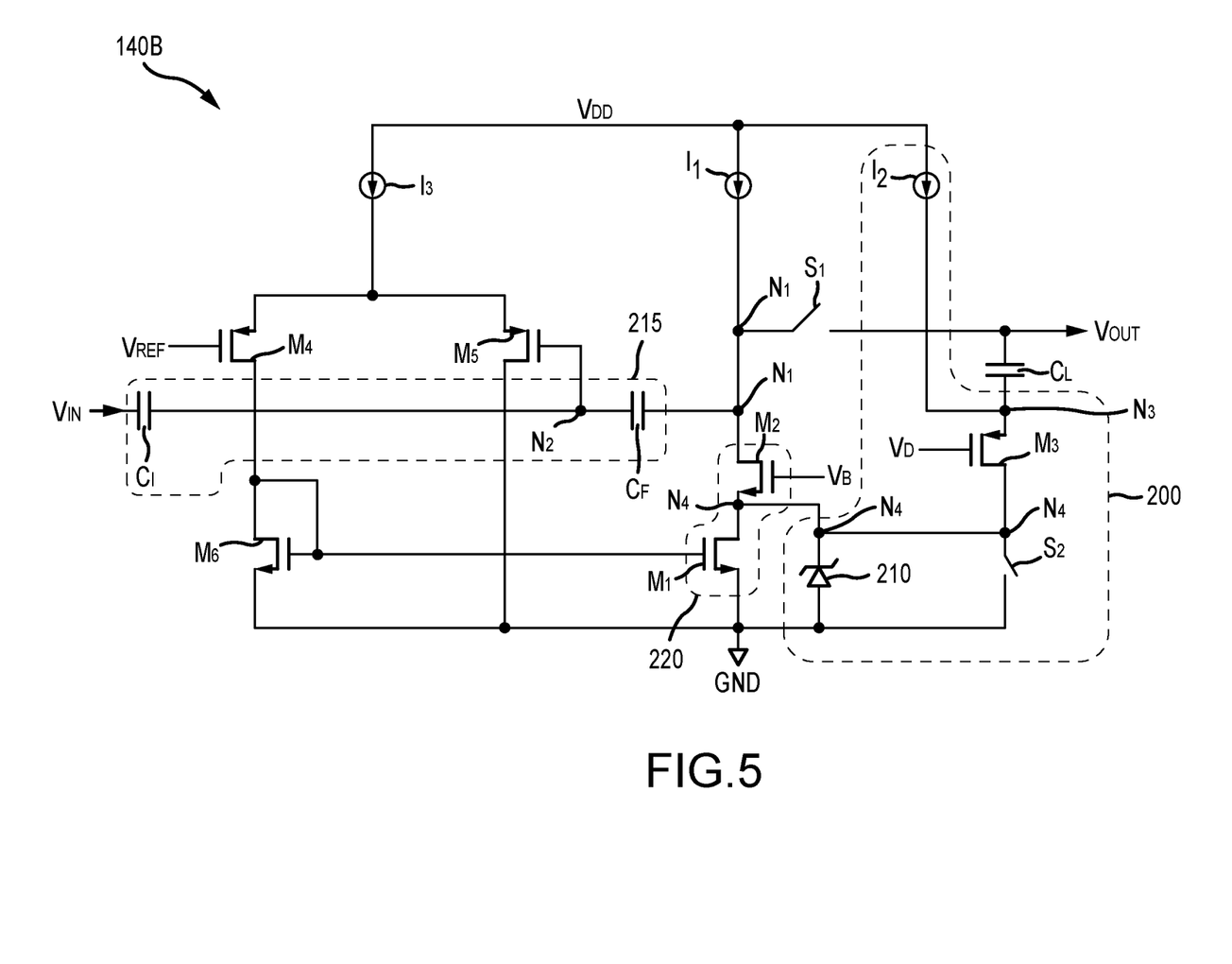
FIG. 5 is a circuit diagram of a differential input track-and-hold amplifier in accordance with an exemplary embodiment of the present technology.

Referring to FIGS. 2 and 5, the T/H amp 140(A/B) may be configured to receive an input signal $V_{IN}$, such as the pixel output, and transmit an output signal $V_{OUT}$ to a secondary circuit, such as the column circuitry 120. The T/H amp 140(A/B) may comprise a gain setting element 215, a first current source $I_1$, a first switch $S_1$, a track-and-hold capacitor $C_L$, a cascode circuit 220, and an isolation circuit 200. The T/H amp 140(A/B) may be configured as a singled-ended input amplifier, for example a single-ended T/H amp 140A as illustrated in FIG. 2, or as a differential amplifier, for example a differential T/H amp 140B as illustrated in FIG. 5. According to various embodiments, the T/H amp 140(A/B) may be coupled to a voltage supply $V_{DD}$.

The cascode circuit 220 may be configured to have a high input impedance, high output impedance, and/or high open-loop gain according to the particular application. In an exemplary embodiment, the cascode circuit 220 is coupled to the first current source $I_1$ at a first node $N_1$ and to a reference voltage, such as a ground voltage GND. For example, the cascode circuit 220 may comprise a first transistor $M_1$ and a second transistor $M_2$ coupled in series. In an exemplary embodiment, the first and second transistors $M_1$, $M_2$ are n-type transistors. The first transistor $M_1$ may be coupled to the input signal $V_{IN}$ via the gain setting element 215 and to the ground GND, for example, a gate terminal may be coupled to the input voltage and a source terminal may be coupled to the ground GND. The second transistor $M_2$ may be coupled to the first current source $I_1$. The second transistor $M_2$ may be coupled to the first current source $I_1$ and a bias voltage $V_B$, for example, a drain terminal may be coupled to the first current source $I_1$ and a gate terminal may be coupled to the bias voltage $V_B$. The cascode circuit 220 may further comprise a fourth node $N_4$ having a connection point positioned between the first and second transistors $M_1$, $M_2$, which also connects one or more other components and/or circuits to the cascode circuit 220.

The first current source $I_1$ may provide a bias current to one or more components of the T/H amp 140(A/B). For example, in an exemplary embodiment, the first current source $I_1$ is coupled to the second transistor $M_2$ of the cascode circuit 220. The first current source $I_1$ may comprise any circuit and/or system suitable for providing a bias current. The value of the current produced by the first current source $I_1$ may be selected according to the specific application, power consumption limitations, and the like.

The gain setting element 215 may be configured to apply a predetermined gain A to the input signal $V_{IN}$. The gain setting element 215 may comprise any suitable circuit and/or system to control the gain of the T/H amp 140(A/B). In various embodiments, the gain setting element 215 may comprise one or more impedance elements, such as capacitors, variable resistors, and/or a combination thereof. For example, in an exemplary embodiment, the gain setting element 215 may comprise a first impedance element, such as a first capacitor $C_I$ and a second impedance element, such as a second capacitor $C_F$ coupled in series, where the gain A of the T/H amp 140(A/B) is equal to the value of the first capacitor $C_I$ divided by the value of the second capacitor $C_F$ (i.e., $A=C_I/C_F$). The gain setting circuit 215 may further comprise a second node $N_2$ positioned between the first and second capacitors $C_I$, $C_F$. The second node $N_2$ may be used as a connection point for other circuits and/or components within the T/H amp 140(A/B). The gain setting element 215 may introduce a first time constant $T_{C1}$ described by: $T_{C1}= (1+A)*(C_I C_F/(C_I+C_F))/g_m$, where $g_m$ is the transconductance of the T/H amp 140(A/B).

The track-and-hold capacitor $C_L$ may be configured to track the input signal $V_{IN}$ and hold a value for a period of time. The track-and-hold capacitor $C_L$ may comprise a first plate (i.e., a first capacitor terminal) and a second plate (i.e., a second capacitor terminal). In an exemplary embodiment, the first plate of the track-and-hold capacitor $C_L$ may be selectively coupled to the first current source $I_1$ via the first switch $S_1$.

Referring to FIG. 8, a track-and-hold capacitor of a conventional track and hold amplifier may introduce a second time constant $T_{C2}$ described by the following: $T_{C2}= (1+A)*C_L/g_m$. In the conventional T/H amplifier, the second time constant $T_{C2}$ further increases the settling time of the output signal $V_{OUT}$.

The isolation circuit 200 may be configured to isolate any transient current in the track-and-hold capacitor $C_L$. The isolation circuit 200 may comprise any number of components, such as transistors, resistors, switching devices, clamping devices, current shunts, and the like, suitable for isolating a desired current. For example, in an exemplary embodiment, the isolation circuit 200 comprises a second current source $I_2$, a third transistor $M_3$, a second switch $S_2$, and a clamp device 210 that operate in conjunction with each other to isolate current from the track-and-hold capacitor $C_L$. In various embodiments, the isolation circuit 200 may be coupled to the voltage supply $V_{DD}$, the track-and-hold capacitor $C_L$, and the cascode circuit 220.

According to an exemplary embodiment, the third transistor $M_3$ is a p-type transistor. The third transistor $M_3$ may be coupled to the second plate of the track-and-hold capacitor $C_L$ and to the second current source $I_2$ at a third node $N_3$. For example, a source terminal of the third transistor $M_3$ may be coupled to the second plate of the track-and-hold capacitor $C_L$ as well as to the second current source $I_2$. The third transistor $M_3$ may be further coupled to the second switch $S_2$, the clamping device 210, and the cascode circuit 220. For example, a drain terminal of the third transistor $M_3$ may be coupled to the second switch $S_2$, which selectively couples the third transistor to the ground GND, to the clamping device 210, and to the cascode circuit 220 via the fourth node $N_4$.

A gate terminal of the third transistor $M_3$ may be coupled to a dynamic voltage $V_D$, which may change values during the operation of the T/H amp 140(A/B). The values of the dynamic voltage $V_D$ may be selected according to the particular application, such as the particular type of signal converter architecture and other relevant factors. For example, the dynamic voltage $V_D$ may supply a DC voltage during a tracking period and may supply a ramp voltage during a holding and/or conversion period.

The third transistor $M_3$ may introduce a third time constant $T_{C3}$ at the output given by: $T_{C3}=C_L/g_{m3}$, where $g_{m3}$ is the transconductance of the third transistor $M_3$. The gain A of the T/H amp 140(A/B) has no effect on the third time constant $T_{C3}$, so even at high gains, there is no degradation of the settling time.

The second current source $I_2$ may provide a bias current to one or more components of the T/H amp 140(A/B). For example, in an exemplary embodiment, the second current source $I_2$ is coupled to the third transistor $M_3$, such as a source terminal of the third transistor $M_3$. The second current source $I_2$ may comprise any circuit and/or system suitable for providing a bias current. The value of the current produced by the second current source $I_2$ may be selected according to the specific application, power consumption limitations, and the like. According to an exemplary embodiment, the current value of the second current source $I_2$ is equal to the current value of the first current source $I_1$ (i.e., $I_1=I_2$).

The clamp device 210 provides a current path from the drain terminal of the third transistor $M_3$ to the ground GND when the first transistor $M_1$ is off. The clamp device 210 may comprise any suitable component having a clamping voltage greater than the steady state drain-to-source voltage $V_{DS}$ of the first transistor $M_1$. For example, in an exemplary embodiment, the clamp device 210 may comprise a Zener diode. In alternative embodiments, however, the clamp device 210 may comprise a diode, a diode-connected transistor, and the like. In an exemplary embodiment, the clamp device 210 is coupled between the fourth node $N_4$ of the cascode circuit 220 and the ground GND. The clamp device 210 is positioned such that a cathode terminal of the clamp device 210 is coupled to the fourth node $N_4$ and the anode terminal of the clamp device 210 is coupled to the ground GND.

Referring to FIG. 5, the differential T/H amp 140B may be configured to receive the input signal $V_{IN}$ as well as a reference voltage $V_{REF}$. The reference voltage $V_{REF}$ may be any voltage level and may be selected according to the particular application. The differential T/H amp 140B may further comprise a fourth transistor $M_4$, a fifth transistor $M_5$, a sixth transistor $M_6$, and a third current source $I_3$.

The third current source $I_3$ may provide a bias current to one or more components of the differential T/H amp 140B. For example, in an exemplary embodiment, the third current source $I_3$ is coupled to the fourth and fifth transistors $M_4$, $M_5$. The third current source $I_3$ may comprise any circuit and/or system suitable for providing a bias current. The value of the current produced by the third current source $I_3$ may be selected according to the specific application, power consumption limitations, and the like. According to an exemplary embodiment, the third current source $I_3$ may be equal to the first current plus the second current, multiplied by two (i.e., $I_3=2(I_1+I_2)$).

The fourth, fifth, and sixth transistors $M_4$, $M_5$, $M_6$ may be configured to provide a current path in response to the reference voltage $V_{REF}$. In an exemplary embodiment, the fourth and fifth transistors $M_4$, $M_5$ are p-type transistors and the sixth transistor $M_6$ is an n-type transistor. In an exemplary embodiment, the fourth and fifth transistors $M_4$, $M_5$ may be coupled in parallel with each other and coupled to the third current source $I_3$. For example, source terminals of the fourth and fifth transistors $M_4$, $M_5$ may be coupled to the third current source $I_3$, a drain terminal of the fifth transistor $M_5$ may be coupled to the ground GND, a gate terminal of the fifth transistor $M_5$ may be coupled to the gain setting element 215, and a gate terminal of the fourth transistor $M_4$ may be coupled to the reference voltage $V_{REF}$. The sixth transistor $M_6$ may be coupled in series with the fourth transistor $M_4$ and the ground GND, for example the drain terminals of the fourth and sixth transistor $M_4$, $M_6$ may be coupled together, and the gate terminal of the sixth transistor M6 may be coupled to the gate terminal of the first transistor $M_1$ and its drain terminal.

According to various embodiments, the first and second switches $S_1$, $S_2$ may be responsive to a control signal transmitted from a control unit, such as the timing and control unit 125 and/or any other circuit suitable for transmitting control signals. For example, the control signal may open or close the switches at a predetermined time and/or interval. The operation of the first and second switches $S_1$, $S_2$ may be predetermined according to the particular application and/or environment. The first and second switches $S_1$, $S_2$ may comprise any suitable circuit and/or device capable of coupling/decoupling one or more components of the T/H amp 140(A/B).

Figure 7:
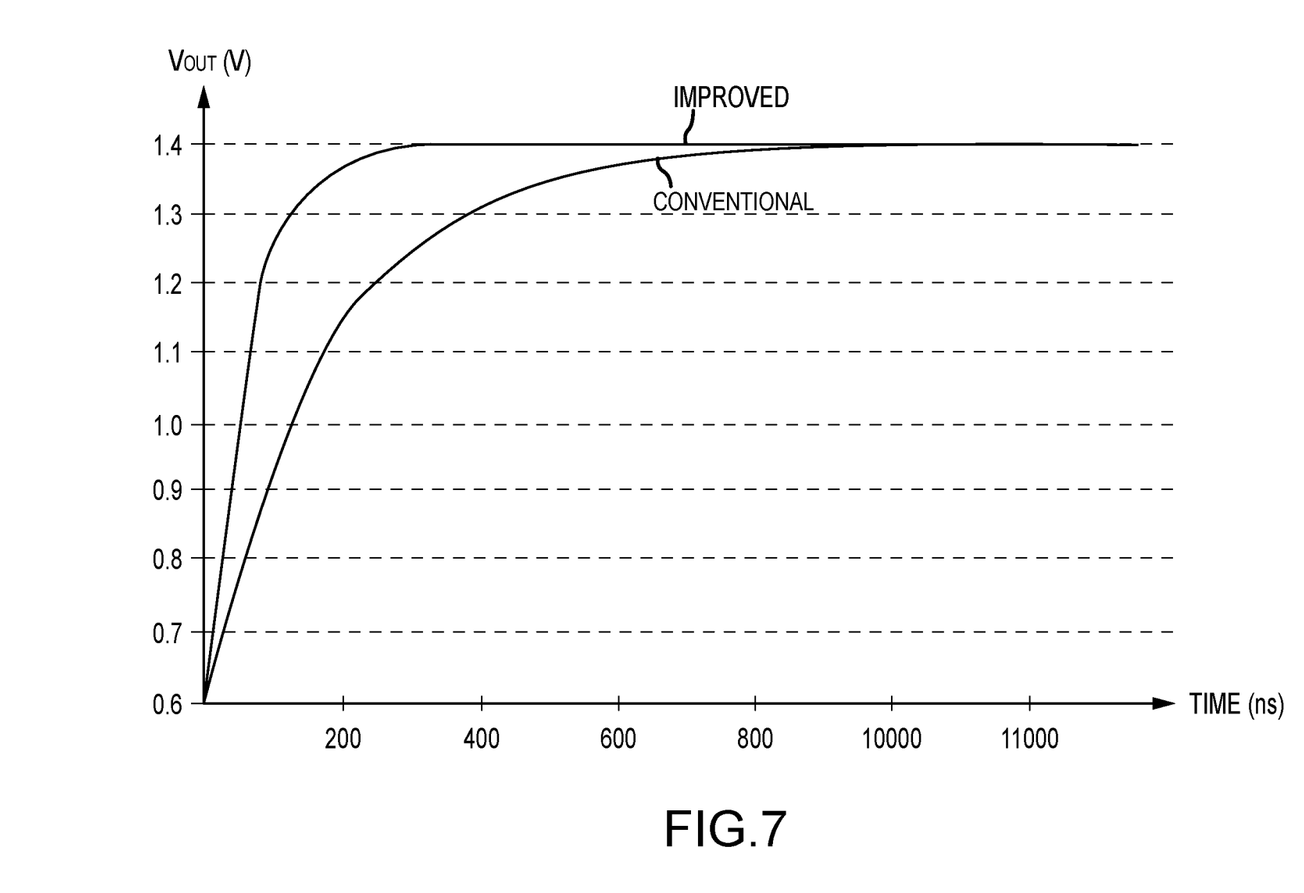
FIG. 7 illustrates output waveforms of a track and hold-amplifier in accordance with an exemplary embodiment of the present technology and a conventional track-and-hold amplifier.

According to various embodiments, the T/H amp 140(A/B) isolates transient current in the track-and-hold capacitor $C_L$ during a track phase, which decreases the settling time of the output signal $V_{OUT}$. According to various embodiments, the T/H amp 140(A/B) utilizes the isolation circuit 200 to redirect current from the track-and-hold capacitor $C_L$ to the first transistor $M_1$ to ensure that the current through the first transistor $M_1$ is constant. By redirecting the current, the settling time is based on the time constant of a series value of the first and second capacitors $C_I$, $C_F$ (i.e., $(C_I C_F)/(C_I+C_F)$) (rather than the track-and-hold capacitor $C_L$, as is the case in a conventional T/H amplifier), which is much smaller than the time constant of the track-and-hold capacitor $C_L$ since the series value of the first and second capacitors $C_I$, $C_F$ is much smaller than the capacitance value of the track-and-hold capacitor $C_L$. For example, and referring to FIGS. 2, 7, and 8, given identical total supply current and capacitor values for the first, second, and track-and-hold capacitors $C_I$, $C_F$, $C_L$, the settling time of the output signal $V_{OUT}$ for the exemplary T/H amp 140(A/B) is approximately 250 ns (where $I_1+I_2=8$ μA, $C_L=1$ pF, $C_I=0.8$ pF, $C_F=0.1$ pF, A=8), while the settling time for the conventional T/H amplifier is approximately 700 ns (where I=8 μA, $C_L=1$ pF, $C_I=0.8$ pF, $C_F=0.1$ pF, A=8).

Figure 4:
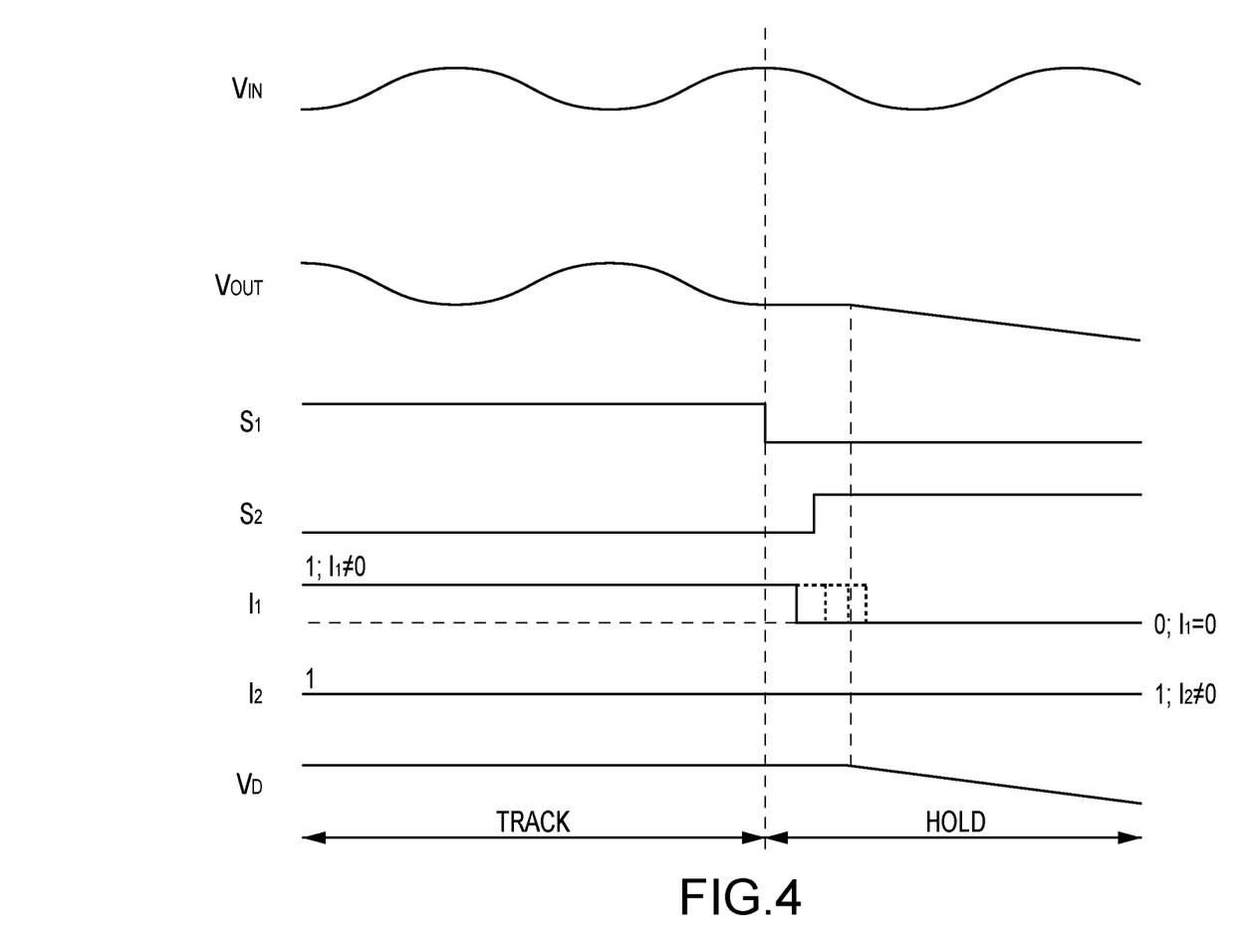
FIG. 4 is an alternative timing diagram of the single-ended input track-and-hold amplifier in accordance with an exemplary embodiment of the present technology.

Referring to FIGS. 2 and 4, in an exemplary operation, the T/H amp 140(A/B) may operate according to a track phase and a hold phase. According to exemplary embodiment, during the track phase, the first switch $S_1$ is closed (ON) and the second switch $S_2$ is open (OFF). Additionally, the first and second current sources are also ON (i.e., $I_1 \neq 0$, $I_2 \neq 0$), and the dynamic voltage $V_D$ is held at a predetermined constant value, such as 1V. This causes the current through the track-and-hold capacitor $C_L$, which is connected to the source terminal of the third transistor $M_3$, to flow back into the first transistor $M_1$ via the fourth node $N_4$. As such, the current through the first transistor $M_1$ is independent of the current through the track-and-hold capacitor $C_L$, and therefore the second time constant $T_{C2}$ of the track-and-hold capacitor $C_L$ has no effect on the settling time of the output signal $V_{OUT}$. Rather, the settling time of the output signal $V_{OUT}$ depends on the first time constant $T_{C1}$, which is much less than the second time constant $T_{C2}$. During the track phase, the output signal $V_{OUT}$ may be inverted with respect to the input signal $V_{IN}$.

Figure 3:
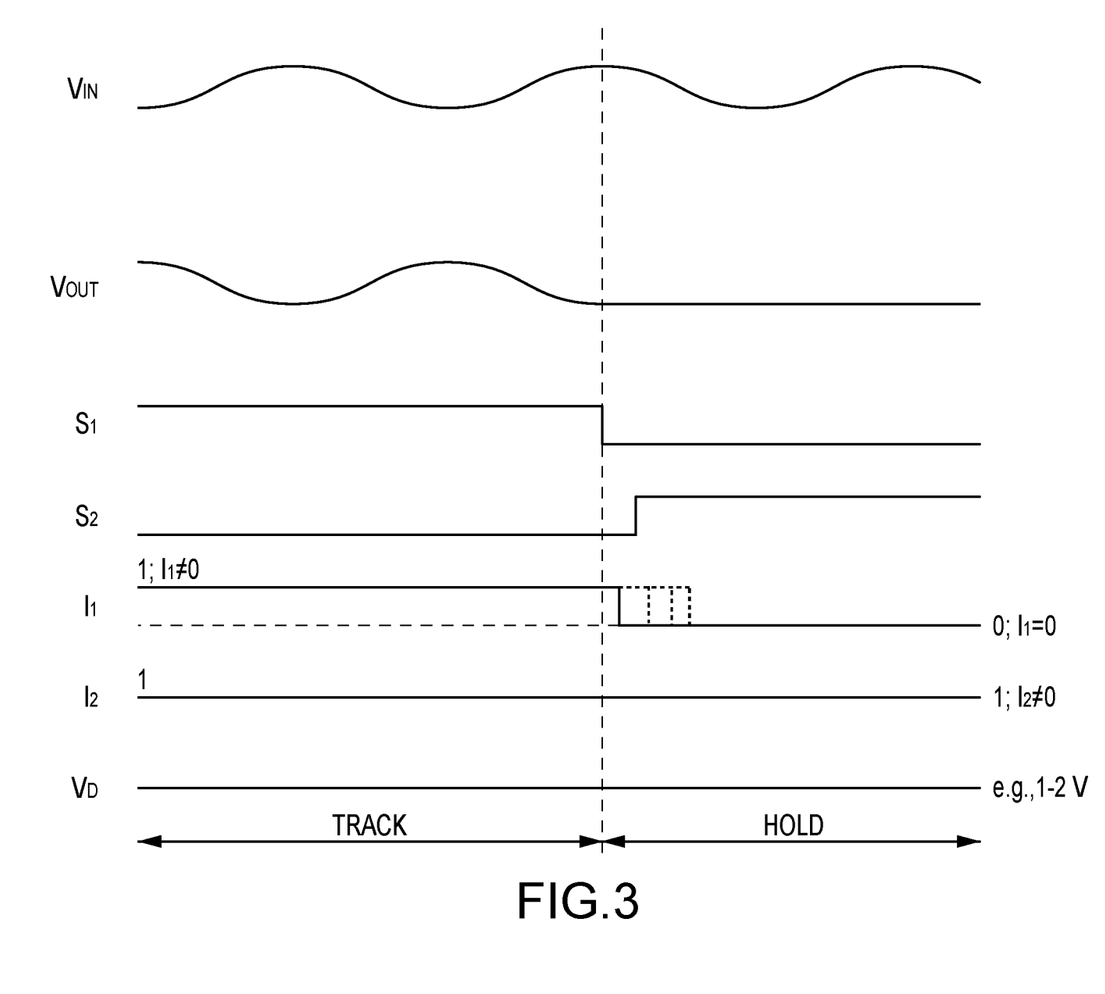
FIG. 3 is a timing diagram of the single-ended input track-and-hold amplifier in accordance with an exemplary embodiment of the present technology.

During the hold phase, the first switch $S_1$ is opened (OFF) and the track-and-hold capacitor $C_L$ holds the value of output signal $V_{OUT}$. The second switch $S_2$ is then closed (ON). According to various embodiments, the first current source $I_1$ may also be turned off to conserve power after the first switch $S_1$ is opened and either before or after the second switch $S_2$ is closed. After the second switch $S_2$ is closed (ON), the dynamic voltage $V_D$ may provide a ramp signal or other appropriate signal and the output signal $V_{OUT}$ follows the dynamic voltage $V_D$. For example, and referring to FIG. 3, the dynamic voltage $V_D$ may maintain a constant value, such as 2V, during both the track phase and the hold phase. The behavior of the dynamic voltage $V_D$ during the hold phase may be selected according to the particular application.

Figure 6:
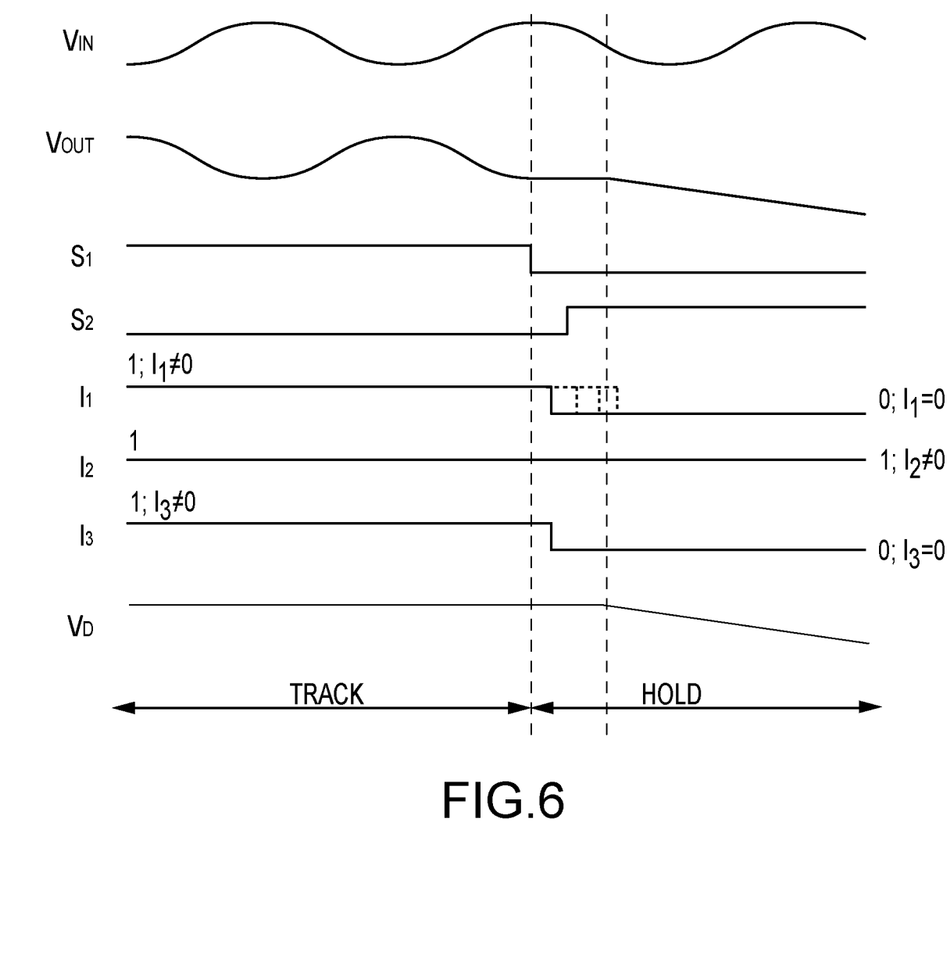
FIG. 6 is a timing diagram of a differential input track-and-hold amplifier in accordance with an exemplary embodiment of the present technology.

Referring to FIGS. 5 and 6, the differential T/H amp 140B operates in the same manner as described above. Additionally, the third current source $I_3$ has the same timing waveform as the first current source $I_1$, as described above. When the third current source $I_3$ is turned on, the fourth, fifth, sixth transistors $M_4$, $M_5$, $M_6$ conduct current.

According to various operations, the first and third transistors $M_1$, $M_3$ may go into a cut-off mode, wherein the transistors act like open circuits. In the case where the first transistor $M_1$ goes into cut-off mode, the clamp device 210 provides a current path around the first transistor $M_1$ to the ground GND. Further, in such a case, if the first current $I_1$ is equal to the second current $I_2$, then the T/H amp(A/B) has a symmetric slew rate SR described by: $SR=C_L*\Delta V_{OUT}/I_1$, where $\Delta V_{OUT}$ is a step difference in the output signal $V_{OUT}$. Even though the settling time of the output signal $V_{OUT}$ may increase due to the finite slew rate, the settling time of the output signal $V_{OUT}$ of the T/H amp 140(A/B) is still much less than a conventional T/H amplifier and is almost independent of the gain A.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A track-and-hold amplifier circuit, comprising:
a gain setting circuit configured to receive an input signal;
a cascode circuit comprising a first terminal, a second terminal, and a third terminal, wherein the cascode circuit is connected to:
the gain setting circuit at a first node via the first terminal, and at a second node via the second terminal; and
a ground node via the third terminal;
a track-and-hold capacitor comprising:
a first capacitor terminal connected to an output node, wherein the output node is selectively connected to the first node; and
a second capacitor terminal; and
an isolation circuit connected to the second capacitor terminal at a third node and the ground node, and wherein the isolation circuit and the cascode circuit share a fourth node.

2. The track-and-hold amplifier circuit according to claim 1, wherein the isolation circuit is configured to selectively isolate transient current in the track-and-hold capacitor and redirect the transient current through at least a portion of the cascode circuit.

3. The track-and-hold amplifier circuit according to claim 1, wherein the cascode circuit is:
directly connected to the gain setting circuit at the first node and the second node; and
directly connected to the ground node.

4. The track-and-hold amplifier circuit according to claim 3, wherein the cascode circuit comprises:

a first transistor directly connected to the first node and a bias voltage; and a second transistor connected in series with the first transistor and directly connected to the second node.

5. The track-and-hold amplifier circuit according to claim 1, wherein the track-and-hold amplifier circuit further comprises a first current source directly connected to the first node.

6. The track-and-hold amplifier circuit according to claim 1, wherein the isolation circuit comprises a clamp device configured to provide a current path from the isolation circuit to the fourth node.

7. The track-and-hold amplifier circuit according to claim 1, wherein the isolation circuit further comprises a switch directly connected between the fourth node and the ground node.

8. The track-and-hold amplifier circuit according to claim 1, wherein the isolation circuit comprises:
a third transistor comprising:
a first terminal connected to the second capacitor terminal at the third node;
a second terminal:
connected to the fourth node; and
selectively connected to the ground node; and
a third terminal coupled to a dynamic voltage.

9. The track-and-hold amplifier circuit according to claim 8, wherein the isolation circuit further comprises a second current source directly connected to the third node.

10. The track-and-hold amplifier circuit according to claim 1, wherein the isolation circuit further comprises a clamp device connected between the cascode circuit and the ground node.

11. The track-and-hold amplifier circuit according to claim 1, wherein the gain setting circuit comprises: a first impedance element connected in series with a second impedance element at the second node, and wherein a series capacitance value of the first and second impedance elements is less than a capacitance value of the track-and-hold capacitor.

12. A system, comprising:
a plurality of pixel columns;
a plurality of track-and-hold amplifier circuits, wherein:
each pixel column is connected to one track-and-hold amplifier circuit from the plurality of track-and-hold amplifier circuits; and
each track-and-hold amplifier circuit comprises:
a gain setting circuit configured to receive an input signal;
a cascode circuit connected to the gain setting circuit at a first node and a second node;
a track-and-hold capacitor comprising:
a first capacitor terminal connected to an output node, wherein the output node is selectively connected to the first node; and
a second capacitor terminal; and
an isolation circuit connected to:
the second capacitor terminal at a third node;
the cascode circuit at a fourth node; and
a ground node.

13. The system according to claim 12, further comprising a ramp analog-to-digital converter configured to receive an output signal from each track-and-hold amplifier circuit at the output node.

14. The system according to claim 12, wherein the isolation circuit comprises:
a clamp device connected between the fourth node and the ground node; and
a switch connected between the fourth node and the ground node.

15. The system according to claim 12, wherein the isolation circuit comprises:
a transistor comprising:
a first terminal connected to the second capacitor terminal at the third node;
a second terminal:
connected to the fourth node; and
selectively connected to the ground node; and
a third terminal coupled to a dynamic voltage.

16. The system according to claim 12, wherein the isolation circuit further comprises a current source directly connected to the third node.

17. A track-and-hold amplifier circuit, comprising:
a gain setting circuit configured to receive an input signal;
a cascode circuit connected to the gain setting circuit at a first node and a second node;
a track-and-hold capacitor comprising:
a first capacitor terminal connected to an output node, wherein the output node is selectively connected to the first node; and
a second capacitor terminal; and
an isolation circuit comprising:
a transistor connected to:
the second capacitor terminal at a third node; and
the cascode circuit at a fourth node; and
a clamp device connected to:
the fourth node; and
a ground node; and
a switch connected between the fourth node and the ground node.

18. The track-and-hold amplifier circuit according to claim 17, wherein the track-and-hold amplifier circuit further comprises a first current source directly connected to the first node.

19. The track-and-hold amplifier circuit according to claim 17, wherein the isolation circuit further comprises a second current source directly connected to the third node.

* * * * *